(12) United States Patent
Maier

(10) Patent No.: US 8,542,076 B2
(45) Date of Patent: Sep. 24, 2013

(54) IMPEDANCE MATCHING

(75) Inventor: Florian Maier, Freiburg (DE)

(73) Assignee: Huettinger Elektronik GmbH + Co. KG, Freiburg (DE)

( * ) Notice: Subject to any disclaimer, the term of this patent is extended or adjusted under 35 U.S.C. 154(b) by 631 days.

(21) Appl. No.: 12/718,136

(22) Filed: Mar. 5, 2010

(65) Prior Publication Data
US 2010/0225411 A1    Sep. 9, 2010

(30) Foreign Application Priority Data
Mar. 5, 2009  (DE) .......................... 10 2009 001 355

(51) Int. Cl.
H03H 7/38    (2006.01)
(52) U.S. Cl.
USPC ........................................................ 333/32
(58) Field of Classification Search
USPC ............. 315/111.21, 111.41, 111.51, 111.71; 333/32, 17.1, 17.3, 17.2, 18, 124, 126, 263
See application file for complete search history.

(56) References Cited

U.S. PATENT DOCUMENTS

| 4,486,722 A * | 12/1984 | Landt ........................... 333/17.3 |
| 5,654,679 A | 8/1997 | Mavretic et al. |
| 5,682,067 A | 10/1997 | Manley et al. |
| 5,936,481 A * | 8/1999 | Fujii ........................... 333/17.3 |
| 6,424,232 B1 * | 7/2002 | Mavretic et al. ............. 333/17.3 |
| 6,499,424 B2 * | 12/2002 | Kazumi et al. ........... 315/111.51 |
| 7,226,524 B2 | 6/2007 | Kasai et al. |
| 2005/0034815 A1 * | 2/2005 | Kasai et al. ............... 156/345.41 |
| 2008/0284537 A1 * | 11/2008 | Ikenouchi ................ 315/111.21 |

FOREIGN PATENT DOCUMENTS

DE    69707129    7/2002

OTHER PUBLICATIONS

Microsemi Corporation, "The Pin Diode Circuit Designer's Handbook", Microsemi Corporation, Watertown, MA, 1998, 137 pages.
Office Action from corresponding German Application No. 10 2009 001 355.5, mailed Oct. 14, 2009, 4 pages.

* cited by examiner

Primary Examiner — Minh D A
(74) Attorney, Agent, or Firm — Fish & Richardson P.C.

(57) ABSTRACT

In an impedance matching circuit selectively operable in a normal matching mode and a protection mode, the impedance matching circuit includes a set of reactances in a first reactance arrangement configured to transform an impedance of a load to an impedance within a range of a nominal impedance of an HF generator in the normal matching mode, and a PIN diode switch having a first invariable switching state in the normal matching mode and a second switchomg state that reconfigures the set of reactances into a second reactance arrangement in the protection mode, such that the second reactance arrangement is configured to transform the impedance of the load to prevent damage to the HF generator or to transmission circuitry arranged between the HF generator and the load.

22 Claims, 4 Drawing Sheets

IMPEDANCE MATCHING

CROSS REFERENCE TO RELATED APPLICATION

This application claims priority under 35 U.S.C. §119(a) to German Application No. 10 2009 001 355.5, filed on Mar. 5, 2009, the entire contents of which are hereby incorporated by reference.

TECHNICAL FIELD

This disclosure relates to impedance matching, wherein transformation of the impedance of a load to a nominal impedance range is carried out in a normal matching mode by a first reactance arrangement.

BACKGROUND

The surface treatment of workpieces using plasma and gas lasers is an industrial process in which a plasma is produced, in particular in a plasma chamber, by direct current or by a high-frequency alternating signal having a working frequency in the range from some 10 kHz into the GHz range. The plasma chamber is connected via further electronic components, such as inductors, capacitors, lines or transformers, to a high-frequency generator (HF generator). Those further components may form oscillating circuits, filters or impedance matching circuits. The electrical load impedance of the plasma chamber (the plasma) which arises during the process depends on the conditions in the plasma chamber and may vary greatly. In particular, the properties of the workpiece, electrodes, and gas ratios are a consideration. High-frequency generators have a limited working range with regard to the impedance of the connected electrical load. If the load impedance leaves a permissible range, the high-frequency generator may be damaged or even destroyed.

For that reason, an impedance matching circuit (matchbox) is generally required which transforms the impedance of the load to a nominal impedance of the generator output (typically 50Ω). If there is a mismatch, it is not possible for the full generator power to be supplied to the load. Instead, some of the power is reflected. In the region of the nominal impedance there is an impedance range, that is, a range of transformed load impedances, in which the generator operates in a stable manner and is not damaged. If the transformed load impedance is outside that nominal impedance range, damage to the generator and instability of the generator may occur as a result of reflected power.

Some impedance matching circuits have a fixed setting or a predefined transforming effect, that is, they consist of electrical components, especially inductors and capacitors, that are not altered during operation. That is appropriate particularly when operation always remains constant, for example in the case of a gas laser. In other impedance matching circuits, at least some of the components of the impedance matching circuits are mechanically variable. For example, in motor-driven rotary capacitors, the capacitance can be varied by altering the arrangement of the capacitor plates relative to one another.

Broadly speaking, three impedance ranges may be associated with a plasma. Before ignition, very high impedances are present. In normal operation, i.e. when working with plasma in accordance with its intended use, lower impedances are present. In the case of undesired local discharges (arcs) or in the case of plasma fluctuations, very low impedances may occur. In addition to the three impedance ranges identified, further, special conditions with other associated impedance values may occur. If the load impedance changes abruptly and if in that case the load impedance or the transformed load impedance leaves a permissible impedance range, the generator and/or the transmission circuitry between the generator and the plasma chamber may be damaged.

PIN diodes are electronic components constructed similarly to a pn diode. In contrast to the pn diode, however, the p-doped layer is not in direct contact with the n-doped layer, but a weakly doped or undoped i-layer lies in between. That i-layer is intrinsic. Since it contains only few charge carriers, however, it has a high resistance. In the forward direction, the PIN diode operates similarly to a normal semiconductor diode. In the case of PIN diodes, however, the lifetime of the charge carriers in the undoped i-layer (i-region) is particularly high. When charge carriers are brought into the i-layer by a forward current, the PIN diode remains constantly conductive even when a high frequency is superposed on the forward current and, as a result, short voltage pulses are periodically applied in the reverse direction. In that state, a PIN diode behaves like a resistor. In the completely switched-on state, voltage drops in the order of magnitude of the forward voltage of the semiconductor material used still occur.

If the diode is operated by applying a direct voltage in the reverse direction, a space charge region of differing width is produced in the p-region and the i-region. Owing to the wide space charge region in the i-region, those diodes are suitable for high reverse bias voltages. For a superposed high frequency, a reverse-biased PIN diode essentially represents a capacitor formed by the depletion layer.

Owing to its behavior as a resistor at high frequencies, a PIN diode may be used as a dc-controlled ac voltage resistor or as a high-frequency switch. In that case, a high-frequency alternating current and a direct current in the forward direction or a dc voltage in the reverse direction may be superposed, thereby enabling the resistance of the i-region to be controlled.

In some impedance matching circuits the mechanically variable reactances (e.g., rotary capacitors, roller inductors) are replaced by capacitor or inductor arrangements controlled by PIN diodes. For example, U.S. Pat. No. 7,226,524 discloses switching in capacitors via PIN diodes in normal matching mode, U.S. Pat. No. 4,486,722 discloses short-circuiting coil sections or switching in capacitors in normal matching mode, and U.S. Pat. No. 5,654,679 describes varying a capacitor by selecting capacitor subunits. However, a great number of PIN diodes with associated activation elements may be required, resulting in an expensive circuit. In addition, high losses may occur since switched-on PIN diodes are not without resistance and reverse-biased PIN diodes are not unrestrictedly good insulators. Still further, some arrangements may not be fast enough to prevent damage to the HF generator or the PIN diodes if there is a sudden change in impedance. Furthermore, parts of inductors carrying HF current that are short-circuited by PIN diodes or inductors short-circuited by PIN diodes and magnetically coupled to inductors carrying HF current may produce losses due to induced currents.

SUMMARY

In one aspect, an impedance matching circuit is provided with which impedance matching may be carried out in normal matching mode with low losses and with which an HF generator may be reliably protected. The impedance matching circuit is selectively operable in a normal matching mode and a protection mode and includes a PIN diode switch which in the normal matching mode has a first defined (invariable) switching state and in a protection mode has a second switching state that reconfigures a set of reactances from a first reactance arrangement into a second reactance arrangement, such that the second reactance arrangement is configured to transform an impedance of the load to prevent damage to the HF generator or to transmission circuitry arranged between the HF generator and the load.

A reactance arrangement is an arrangement of a set of reactances (e.g., inductances, capacitances and/or transformation members, such as lines of a certain length), that carries out a certain impedance matching. The reactance arrangement for the normal matching mode may be a fixed arrangement, i.e. the capacitance values and the inductance values of the individual reactances of the reactance arrangement are not variable during normal matching mode. In normal matching mode, the PIN diode switches are also not switched. Alternatively, it is conceivable for impedance matching to be effected in normal matching mode in such a way that one or more reactances (capacitance, inductance or transformation member) are mechanically altered so that another reactance value is established. In that case also, the switching state of the PIN diode switches is not altered in normal matching mode. The switching state of one or more PIN diode switches is altered only to switch back and forth between normal matching mode and protection mode.

In particular, it is provided that in normal matching mode transformation of the impedance of the load to an impedance range in which the generator is able to deliver power to the load takes place. With a view to low losses, that impedance transformation is regulated mechanically or is performed with a fixed setting. In a protection mode, that is, if there is risk that the HF generator will be damaged, only few PIN diode switches are used, and ideally only one PIN diode switch, to switch at least one reactance (inductance, capacitance or transformation member) in such a manner that the impedance then obtained is in a range that is not hazardous to the HF generator and the transmission circuitry. In that manner, HF generator and transmission circuitry are protected.

In some implementations, the impedance matching circuit has a plurality of PIN diode switches, wherein in normal matching mode, only some of the PIN diode switches are arranged in the power transmission path. It is thereby possible for individual circuit elements or alternatively a group of circuit elements to be connected into or disconnected from the HF path by means of PIN diode switches in order to transform an impermissible load impedance to the permissible range. This means that the impedance matching circuit is controlled in such a manner that the load impedance in the Smith diagram which is seen by the generator and which, owing to changes in the state of the load, has suddenly moved out of the impedance range that is safe for the generator is rapidly transformed back to that range and the generator and the transmission circuitry are thus protected.

The switch positions of the PIN diode switches and the connected reactances are each to be selected such that, in a state corresponding to a normal matching mode, the mechanically variable reactances of the impedance matching circuit or the fixed-setting reactances of the impedance matching circuit are able to undertake the impedance matching, wherein at most one or few PIN diode switch(es) may be involved in the transmission of the high-frequency power in order to keep the losses to a minimum. The term "involved" is to be understood in this context as meaning that the PIN diode switches are either switched on and a high-frequency current flows through them or that they are reverse-biased and they prevent a high-frequency current between two points. In that respect, the circuit variant in which in normal matching mode only a reverse-biased PIN diode switch is connected to the power transmission path offers advantages. In that case, only the additional depletion layer capacitance of the PIN diode has to be taken into consideration in the impedance matching circuit; losses due to the resistance of a switched-on PIN diode do not occur in normal matching mode.

To convert the set of reactances from the first reactance arrangement into the second reactance arrangement, at least one reactance may be connectable to or disconnectable from the first reactance arrangement via a PIN diode switch. As already mentioned, the reactances in the first reactance arrangement may include at least one reactance having a mechanically variable reactance value. It may be provided, in particular, that no mechanical variation of a reactance value takes place in a protection mode.

Furthermore, a plurality of PIN diode switches may be provided, the PIN diode switches being assigned respective switching states to selectively configure a set of reactances into different protective mode arrangements, including a first protective mode arrangement in an unignited plasma condition and a second protective mode arrangement on occurrence of a plasma arc. To convert the first reactance arrangement into another reactance arrangement, reactances may be switched in or cut out. This means that parallel capacitances, inductances or transformation members may be additionally connected or may be disconnected. It is also conceivable that, by closing, the PIN diode switches are used to shunt serial capacitances or that, by opening such a switch, shunting is cancelled. Furthermore, tapping of a series of capacitances, inductances or transformation members may be done via the PIN diode switches. The additional connection of one or more capacitances, inductances or transformation members via a PIN diode switch is also conceivable. In that case, additional inductances, capacitances or transformation members or the inductances, capacitances or transformation members or parts thereof used in normal matching mode may be affected by the switching operations of the PIN diode switches.

It is also possible for groups of circuit elements or entire networks to be switched in or cut out for the protection mode. For example, an LC member of the impedance matching circuit may be cut out or may be replaced or supplemented by another LC member.

In protection mode, correction reactances or also reactances or parts thereof that are active in normal matching mode may be switched in or cut out in order in that manner to achieve at least approximate impedance matching and protect the HF generator and other parts of the circuit.

The use of a mechanical impedance matching circuit comprising high-quality components, for example vacuum rotary capacitors and silver-plated air-core inductors, keeps down the losses in the impedance matching circuit in normal matching mode. In certain applications, for example in the case of gas lasers, a fixed-setting impedance matching circuit may also be sufficient for impedance matching in normal matching mode. Since the mechanical impedance matching circuit is able to react only very slowly to rapid impedance changes in the load, and the fixed-setting impedance matching circuit not at all, it is assisted in such cases by a limited number of rapidly connectable or disconnectable reactances.

At least one dc current source which has an associated overshoot device and which is associated with a PIN diode switch may be provided for switching on the PIN diode switch. That measure makes it possible to obtain rapid switching of the PIN diode to the conducting state. At the moment of being switched on, the PIN diode receives a higher current than in subsequent switched-on operation. The build-up of charge carriers in the diode is thus intensified at the instant of switching on.

Furthermore, a dc voltage source with associated overshoot device may be associated with at least one PIN diode switch to produce a reverse bias voltage. In that manner, rapid switching of the PIN diode to the non-conducting state can be obtained. In the switching off operation, initially a higher voltage is applied in the reverse direction than in subsequent reverse-biased operation. In that manner, depletion of charge carriers in the PIN diode is intensified at the instant of switching off.

At least one PIN diode switch may be connected to an inductor or an arrangement of inductors, so that, with an appropriate switch position of the PIN diode switch(es), inductors remain open at one end. A plurality of PIN diode switches may in this case be connected in series. If, therefore, an inductance is to be altered by a PIN diode switch, it is advantageous if inductor parts that are not used in a switch position or if a proportion of inductors magnetically coupled to one another are not short-circuited but are switched off at least at one end, that is to say, the choice of inductor tapping by a PIN diode switch or disconnection of the inductor from the circuit by a PIN diode switch, so that there are no short-circuited inductors or inductor parts in which currents could be induced and could cause losses there. Since high HF voltages may occur at the open end of an inductor in that case, a correspondingly large number of PIN diodes may be connected in series.

Measurement and evaluation circuitry may be provided for detection of the state of the load, especially the plasma load. Using the measurement and evaluation circuitry, undesired load impedances may be detected and appropriate countermeasures may be instituted. In particular, the PIN diode switches may be activated in such a manner that a first reactance arrangement of the normal matching mode is converted into another reactance arrangement in protection mode. The further processing of the acquired measuring signals is simplified if an analogue-to-digital converter is provided for digitizing acquired measuring signals.

In order to be able to alter the switching states of the PIN diode switches, it is advantageous if a control circuit is provided for controlling the PIN diode switches. In addition, a memory may be provided for storing parameters associated with the states of the load. In particular, it is possible for load states and associated reactions, i.e. switch positions of the PIN diode switches, to be stored in the memory. It is thus possible to react to different load states in a predefined manner.

The way in which an impedance matching circuit operates will be described hereinafter with reference to a plasma process. Before operation of the plasma chamber is commenced, the mechanical components of the impedance matching circuit may be adjusted in such a manner that it results in matching in the normal matching mode. To protect the HF generator from the high impedance of the plasma chamber containing the as yet unignited plasma, first a second reactance arrangement, which is different from that first reactance arrangement, is adjusted, that is to say, first at least one reactance is switched in or cut out by means of a PIN diode switch, in order to bring about approximate matching of the plasma chamber. As soon as the plasma has been ignited, the further reactance is switched to the position corresponding to the normal impedance matching mode, with the result that the first reactance arrangement is produced. The impedance matching circuit may then assume its normal regulating function, for example by means of the reactance values of individual reactances being adjusted by mechanical variation of the reactances. In that case, the correct reactance values for matching may already have been approximately obtained as a result of the described pre-adjustment.

If during operation an arc is detected, similarly at least one reactance is switched in or cut out by the associated PIN diode switch, with the result that another, third reactance arrangement is produced and the impedance of the plasma chamber as seen from the generator is again in the non-hazardous impedance range of the generator. After quenching of the arc, the PIN diode switches are returned to the switch position of the normal matching mode and the first reactance arrangement may again undertake the impedance matching. In protection mode, the mechanically variable reactances are preferably left unchanged so that, after switching of the PIN diode switches to the normal matching mode, they are immediately able to undertake matching in normal matching mode.

Another aspect of the invention features matching an impedance with an impedance matching circuit by transforming an impedance of a load with a set of reactances in a first reactance arrangement to an impedance within a range of a nominal impedance of an HF generator in a normal matching mode, and altering a switching state of a PIN diode switch from a first invariable switching state in the normal matching mode to a second switching state in a protection mode form a second reactance arrangement configured to transform an impedance of the load to prevent damage to the HF generator or to transmission circuitry arranged between the HF generator and a plasma load.

To form the second reactance arrangement from the first reactance arrangement, at least one reactance of the first reactance arrangement may be switched in or cut out of the first reactance arrangement via a PIN diode switch. In normal matching mode, at least one reactance value may be varied by mechanical variation of a reactance. In one variant of the method, it may be provided that, in a first protection mode, a second reactance arrangement is formed by switching at least one PIN diode switch and, in a second protection mode, a third reactance arrangement is formed by switching at least one PIN diode switch.

In order to be able to carry out good impedance matching as quickly as possible, pre-adjustment of the impedance matching circuit may be effected for a normal matching mode by adjusting at least one reactance provided for the normal matching mode and having a mechanically variable reactance value.

Losses may be reduced if (partial) inductances not used in a reactance arrangement are left open at one end.

Rapid alteration of the switching state of a PIN diode switch may be achieved if a PIN diode switch is switched on by applying a current in the forward direction with initial overshoot.

Rapid alteration of the switching state of a PIN diode may furthermore be effected if a PIN diode switch is reverse-biased by applying a reverse bias voltage with initial overshoot.

Particular advantages may be obtained if parameters for the normal matching mode and/or for a protection mode are ascertained by calibration of the impedance matching circuit and stored. The parameters so ascertained may later be used to carry out a pre-adjustment for the normal matching mode or to enable switching of the PIN diode switches for transformation to a non-hazardous impedance in the case of operating states that are normally hazardous to the HF generator.

The length of the connection line between HF generator and plasma load can be measured and taken into consideration in the selection of the switch positions of the PIN diode switches. The impedance matching can thereby be improved. In order to be able to decide whether a normal matching mode or a protection mode has to be carried out it is advantageous to ascertain quantities related to the state of the plasma load. For example, current or voltage, a phase angle, the reflected power or the like may be detected.

Further features and advantages will be apparent from the following detailed description of illustrative embodiments of the invention with reference to the Figures of the drawings, and from the claims. The features shown therein are not necessarily to be understood as being to scale and are illustrated in such a way as to enable significant elements to be made clear. In some implementations, the various features may be implemented individually or a plurality thereof may be implemented in any desired combination.

DESCRIPTION OF DRAWINGS

Like reference symbols in the various drawings indicate like elements.

DETAILED DESCRIPTION

Figure 1:
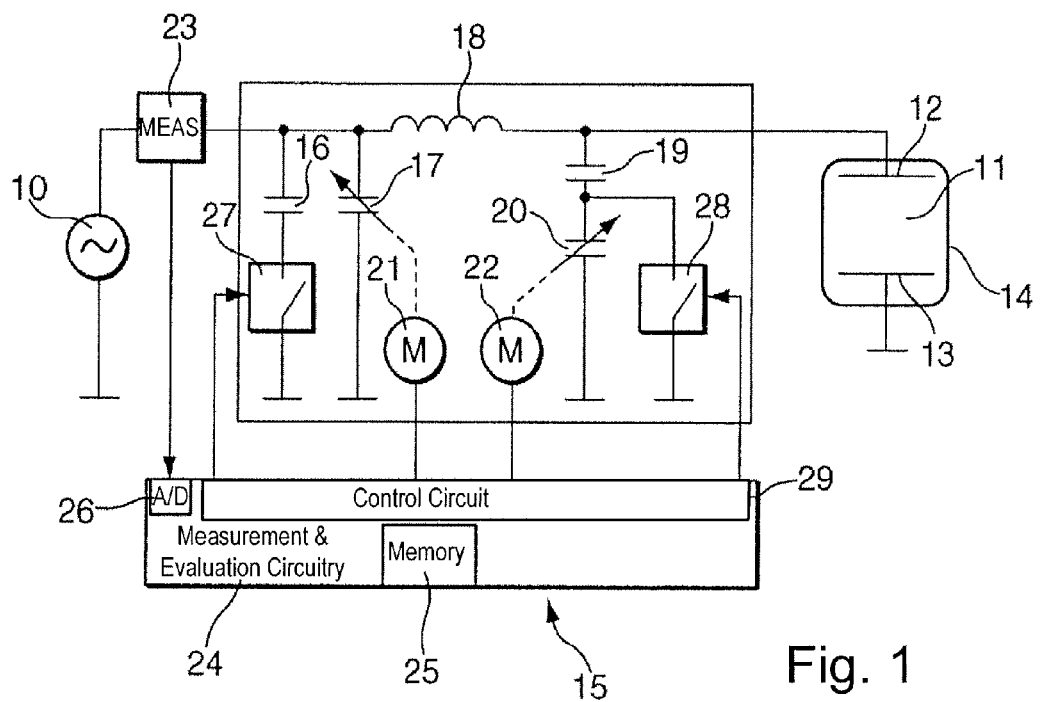
FIG. 1 shows an impedance matching circuit connected between an HF generator and a load.

FIG. 1 shows an HF generator 10 which supplies a plasma load 11 with power. The plasma forms between the electrodes 12, 13 in a plasma chamber 14. An impedance matching circuit 15 is arranged between the HF generator 10 and the plasma load 11. The impedance matching circuit 15 includes the reactances 16-20, the reactances 16, 19 being in the form of capacitors of invariable capacitance, the reactances 17, 20 being in the form of capacitors of mechanically variable capacitance, and the reactance 18 being in the form of inductance. The motors 21, 22 indicate that the reactances 17, 20 are mechanically variable.

A measuring device 23 measures quantities that are related to the state of the load 11. In that manner it is possible to detect whether the load is within a permissible range so that the load may be transformed to a nominal impedance or a nominal impedance range which is not hazardous to the HF generator 10, or whether the load 11 has an impedance that cannot be transformed to the nominal impedance range. The evaluation is carried out by measurement and evaluation circuitry 24 having a memory 25 in which different states of the load 11 and correspondingly associated parameters are stored.

If, for example, the measurement and evaluation circuitry 24, which may include an analogue-to-digital converter 26, detects that transformation to the nominal impedance range is possible, a normal matching mode is established. This means that the PIN diode switches 27, 28 are activated by a control circuit 29 in such a way that a first reactance arrangement is produced.

For example, the PIN diode switch 27 may be activated in such a way that it is closed and the PIN diode switch 28 may be activated in such a way that it is opened. This means that the first reactance arrangement includes all the reactances 16-20. If, on the other hand, it is detected that transformation to the nominal impedance range is not possible, the control circuit 29 causes the PIN diode switches 27, 28 to be activated in such a way that the PIN diode switch 27 is opened and the PIN diode switch 28 is closed. This means that the reactance 16 is no longer involved in an impedance transformation and the reactance 20 is shunted by the PIN diode switch 28, with the result that it too is no longer involved in an impedance transformation. Accordingly, a second reactance arrangement, including the reactances 17, 18 and 19, is produced for a protection mode.

In protection mode, the reactance values of the mechanically variable reactances 17, 20 are not intended to be altered. That ensures that, on changing from the second reactance arrangement to the first reactance arrangement, the reactances 17, 20 still have values that enable the load impedance to be transformed to a nominal impedance range as quickly and as easily as possible. In normal matching mode, on the other hand, the reactances 17, 20 are altered in such a way that the optimum possible impedance matching takes place. It should further be noted that the PIN diode switches 27, 28 preferably do not change their switching states either in normal matching mode or in protection mode.

Figure 2:
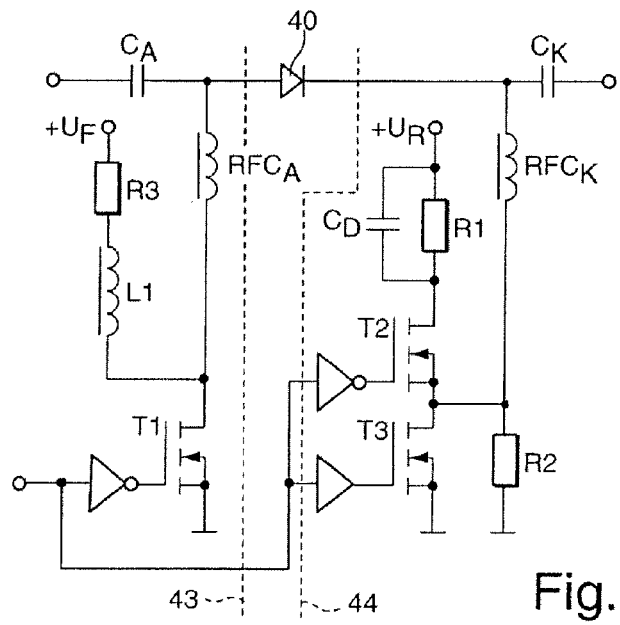
FIG. 2 shows a driving arrangement for accelerating the charge carrier situation in the depletion layer of a PIN diode.

In FIG. 2, a circuit for activating the PIN diode switch 40 is illustrated. It will first be explained how the PIN diode switch 40 is switched on. From the voltage source +UF a current passes through the resistor R3, the inductor L1 and the switch T1 formed by a transistor to earth. The inductance of the inductor L1 may be higher than the inductance of the chokes RFCA and RFCK. In any event, the inductance of the inductor L1 should be at least sufficiently great that, after opening of the switch T1, the self-induction of the inductor L1 is able, as a result of a voltage overshoot, to rapidly build up a current counter to the self-inductions of the chokes RFCA and RFCK through the PIN diode 40 and the switch T3 to earth. In that manner, the charge carriers are driven into the depletion layer of the PIN diode 40. In the steady state, the dc current via the PIN diode 40 and the switch T3 is limited by the resistor R3, and the combination of voltage source +UF with resistor R3 may, when suitably dimensioned, be regarded as a current source.

Switching off of the PIN diode switch 40 is done by means of the switch T1 short-circuiting to earth the current from the voltage source +UF via the resistor R3 and the inductor L1 and, at the same time, the anode of the PIN diode 40 via the choke RFCA. The switch T2 applies the dc reverse bias voltage +UR via the choke RFCK to the cathode of the PIN diode 40. The value of +UR is higher than is desired as reverse bias voltage in the steady state. It is brought to the correct magnitude by the voltage divider R1, R2. At the moment of switching on, however, R1 is short-circuited through the capacitor CD, with the result that +UR is applied in full to the cathode of the PIN diode 40 and drives the charge carriers out of the depletion layer. The circuit on the left-hand side of the dashed line 43 accordingly constitutes a direct current source with overshoot device. The circuit on the right-hand side of the dashed line 44, on the other hand, constitutes a dc voltage source with overshoot device.

Figure 3A:
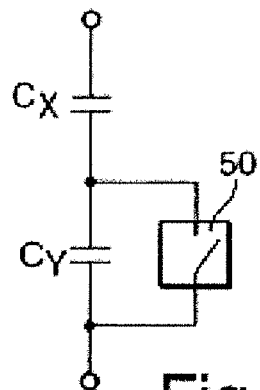
FIG. 3a shows an example of circuitry for reducing the capacitance of a capacitor.

FIG. 3a shows a series connection, consisting of the capacitors Cx, Cy. A PIN diode switch 50 is arranged parallel to the capacitor Cy. If the PIN diode switch 50 is closed, the capacitor Cy is shunted, with the result that only the capacitor Cx is effective. If, on the other hand, the PIN diode switch 50 is opened, the capacitor Cy is not shunted, with the result that the series connection of the capacitors Cx, Cy is effective. It is thus possible to alter a reactance arrangement in an especially simple manner. For example, the circuit of FIG. 3a could be used in an impedance matching circuit.

Figure 3B:
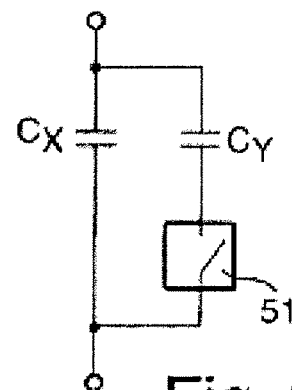
FIG. 3b shows an example of circuitry for increasing the capacitance of a capacitor.

FIG. 3b shows a parallel connection of the capacitors Cx, Cy, with a PIN diode switch 51 being arranged in series with the capacitor Cy. The capacitance of the overall arrangement can be altered by altering the switching state of the PIN diode switch 51. If the PIN diode switch 51 is opened, only the capacitor Cx is effective, if the PIN diode 51 is closed, the parallel connection of Cx and Cy is effective.

Figure 4A:
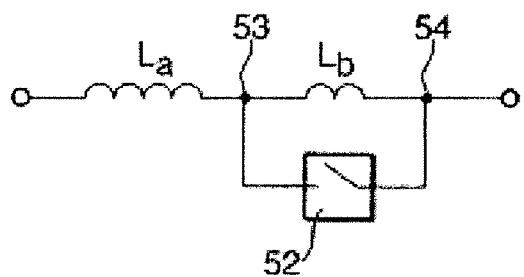
FIG. 4a shows a series connection of two inductor parts.

FIG. 4a shows a series connection of two inductors La, Lb, with a PIN diode switch 52 being arranged parallel to the inductor Lb. The point 53 between the inductors La, Lb may also be regarded as a tap. That tap can be short-circuited to the point 54 by closing the PIN diode switch 52. In that manner the total inductance can be reduced. With this configuration, however, the current induced in the inductor Lb flows in a circle and produces losses in the inductor La.

Figure 4B:
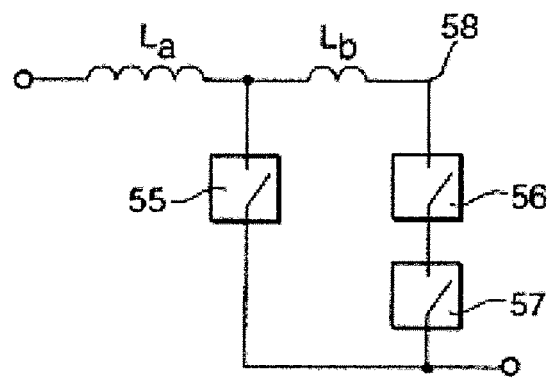
FIG. 4b shows an arrangement of PIN diode switches at a inductor.

To avoid that, an arrangement as shown in FIG. 4b may be provided, wherein a total of three PIN diode switches 55-57 is provided. The PIN diode switch 55 is not closed simultaneously with the PIN diode switches 56, 57. If the PIN diode switch 55 is closed, the PIN diode switches 56, 57 are opened, with the result that the end 58 of the inductor Lb is open. The series connection of two PIN diode switches 56, 57 increases the withstand voltage at the end of the inductor Lb. A current flowing in a circle can be prevented by the arrangement of PIN diode switches 56, 57 at both ends of the inductor Lb. In that manner, losses in the inductor La are also avoided.

Figure 4C:
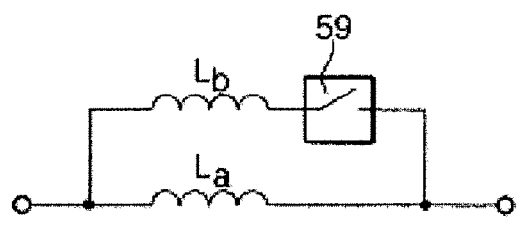
FIG. 4c shows a parallel connection of inductors for reducing inductance.

FIG. 4c shows a parallel connection of inductors La, Lb, wherein a PIN diode switch 59 is provided in series with the inductor Lb. If the PIN diode switch 59 is opened, the parallel connection is cancelled, with the result that only the inductor La is effective. The end of the inductor Lb is switched open by opening the PIN diode switch 59. This means that the end is cut off from the rest of the circuit.

The circuit arrangements shown in FIGS. 4b, 4c, in particular, may be used in the impedance matching circuit.

Figure 5:
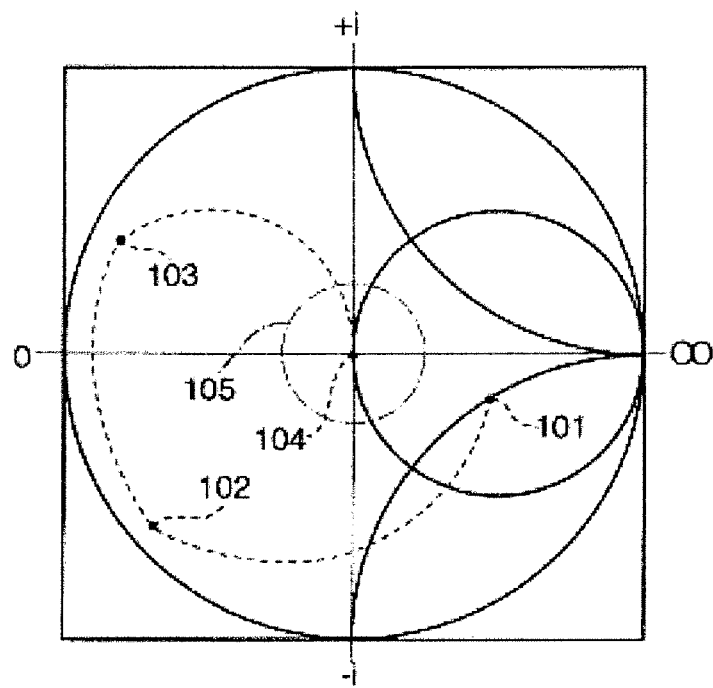
FIG. 5 shows a Smith diagram illustrating impedance matching in normal matching mode.

FIG. 5 shows a Smith diagram 70. At the point 101, there is the impedance of the load in normal operation. By means of a first reactance of the first reactance arrangement transformation of the impedance to the point 102 occurs. From there, transformation of the impedance by a second reactance of the first reactance arrangement to point 103 occurs. There, a transformation to point 104 occurs by means of a third reactance of the first reactance arrangement. The circle 105 marks the nominal impedance range acceptable for the HF generator. This means that, by means of the first reactance arrangement, transformation of the load impedance takes place to a nominal impedance range that allows stable non-destructive operation of the HF generator.

Figure 6:
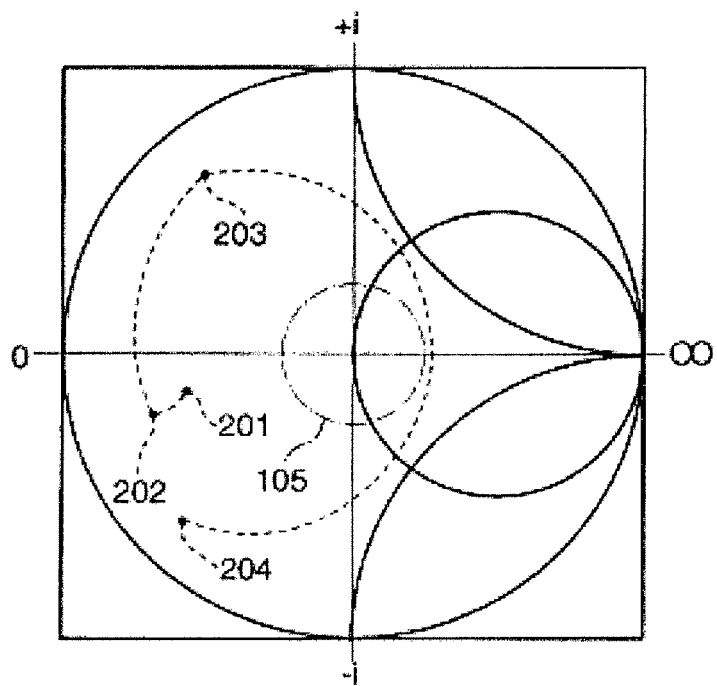
FIG. 6 shows a Smith diagram illustrating changing of the impedance when an arc occurs.

FIG. 6 shows the situation obtained if, for example, an arc occurs. An arc reduces the impedance of the load, for example to a tenth of the normal operating impedance of the load, with the result that the impedance at point 201 is obtained. The reactances of the first reactance arrangement would carry out a transformation via the points 202, 203 to the point 204. That impedance at point 204 is clearly outside the circle 105, and therefore transformation to an impedance that is outside the nominal impedance range takes place.

Figure 7:
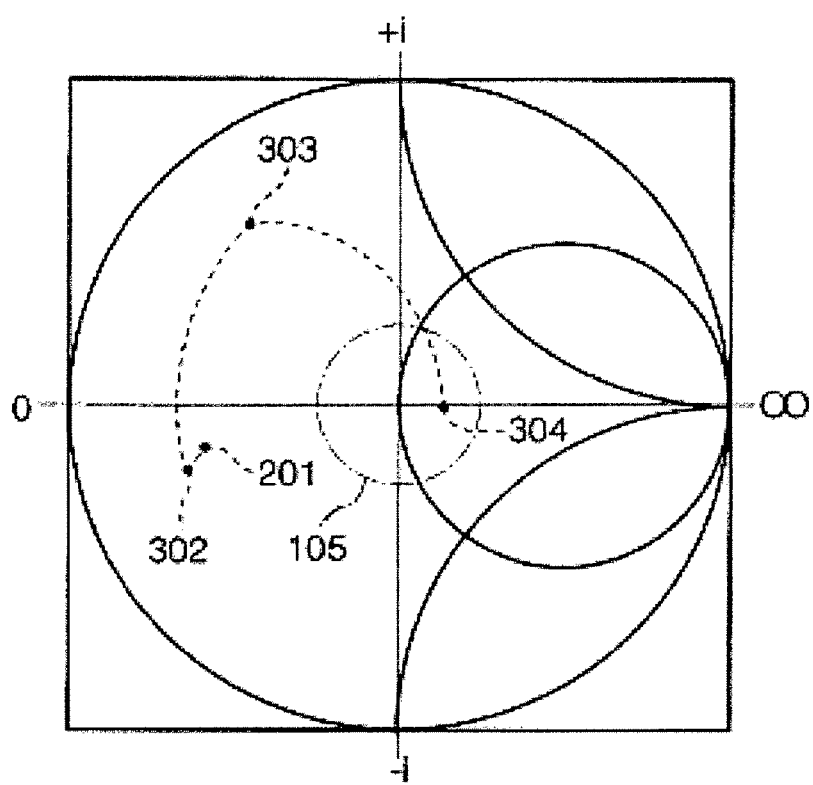
FIG. 7 shows a Smith diagram illustrating impedance matching in a protection mode.

FIG. 7 shows the situation if impedance matching is carried out in protection mode by a second reactance arrangement. The load impedance at point 201 is transformed by means of reactances of the second reactance arrangement via the points 302, 303 to the impedance at point 304 which is within the permissible impedance range 105. The adapted impedance at point 304 is not ideal (it does not lie in the middle of the Smith diagram), but is clearly within the acceptable range 105. The normal matching mode of the impedance matching circuit is suspended for the duration of the arc. After quenching of the arc, the PIN diodes switches are returned to their original switching state. In that manner, the first reactance arrangement is established again. That arrangement is immediately ideally matched and is able to carry out the impedance matching in normal matching mode.

What is claimed is:

1. An impedance matching circuit selectively operable in a normal matching mode and a protection mode, the impedance matching circuit comprising:
   a control circuit configured to, while the impedance matching circuit is operating in the normal matching mode, cause the impedance matching circuit to operate in the protection mode in response to determining that a load is in a hazardous state;
   a set of reactances in a first reactance arrangement configured to transform an impedance of the load to an impedance within a range of a nominal impedance of an HF generator in the normal matching mode; and
   a PIN diode switch having a first invariable switching state in the normal matching mode, and a second switching state that reconfigures the set of reactances into a second reactance arrangement in the protection mode, wherein the second reactance arrangement is configured to transform the impedance of the load to prevent damage to the HF generator or to transmission circuitry arranged between the HF generator and the load and further comprising a DC voltage source having an associated overshoot device and associated with the PIN diode switch to produce a reverse bias voltage.

2. The impedance matching circuit of claim 1, wherein the PIN diode switch is operable to switch in or cut out at least one reactance of the set of reactances, to reconfigure the set of reactances into the second reactance arrangement.

3. The impedance matching circuit of claim 1, wherein the set of reactances includes at least one reactance having a mechanically variable reactance value.

4. The impedance matching circuit of claim 1 configured for use in a plasma system, wherein the PIN diode switch is one of a plurality of PIN diode switches having respective switching states assigned to selectively configure the set of reactances into one of multiple protection mode reactance arrangements.

5. The impedance matching circuit of claim 1, further comprising at least one DC current source having an associated overshoot device and associated with the PIN diode switch to forward bias the PIN diode switch.

6. The impedance matching circuit of claim 1, wherein the PIN diode switch is connected in series with an inductor.

7. The impedance matching circuit of claim 6, wherein the PIN diode switch is one of a plurality of PIN diode switches connected in series.

8. The impedance matching circuit of claim 1, further comprising measurement and evaluation circuitry operable to detect a state of the load.

9. The impedance matching circuit of claim 8, wherein the measurement and evaluation circuitry includes an analog-to-digital converter to digitize acquired measuring signals.

10. The impedance matching circuit of claim 1, further comprising a control circuit coupled to the PIN diode switch to control the PIN diode switch.

11. The impedance matching circuit of claim 1, further comprising a memory for storing parameters associated with one or more states of the load.

12. A method of matching impedance with an impedance matching circuit, the method comprising:
   transforming, by a first reactance arrangement, an impedance of a load to an impedance within a range of a nominal impedance of an HF generator in a normal matching mode;
   while the impedance matching circuit is operating in the normal matching mode, causing the impedance matching circuit to operate in the protection mode in response to determining that the load is in a hazardous state; and
   altering a switching state of a PIN diode switch from a first invariable switching state in the normal matching mode to a second switching state in the protection mode to form a second reactance arrangement configured to transform an impedance of the load to prevent damage to the HF generator or to transmission circuitry arranged between the HF generator and the further comprising applying a reverse bias voltage with initial overshoot to the PIN diode switch to reverse bias the PIN diode switch.

13. The method of claim 12, wherein altering the switching state of the PIN diode switch to the second switching state in the protection mode switches in or cuts out at least one reactance of the first reactance arrangement.

14. The method of claim 12, further comprising mechanically altering at least one reactance value of a reactance.

15. The method of claim 12, wherein the PIN diode switch is one of a plurality of PIN diode switches with selectable states, the method comprising altering the states of the switches in the protection mode to selectively configure the circuit into one of multiple protection mode reactance arrangements.

16. The method of claim 12, further comprising adjusting at least one reactance having a mechanically variable reactance value to pre-adjust the impedance matching circuit in the normal matching mode.

17. The method of claim 12, wherein at least one of the reactance arrangements includes an inductor coupled in series with the PIN diode switch.

18. The method of claim 12, further comprising applying a current to the PIN diode switch in a forward direction with initial overshoot to forward bias the PIN diode switch.

19. The method of claim 12, further comprising:
   determining parameters for normal matching mode and/or the protection mode by calibrating the impedance matching circuit, and
   storing the determined parameters.

20. The method of claim 12, further comprising:
   determining a length of a connection line between the HF generator and the load; and
   selecting a switching state of the PIN diode switch based on the length.

21. The method of claim 12, wherein altering the switching state of the PIN diode switch from the first invariable switching state in the normal matching mode to the second switching state in the protection mode comprises:
   determining one or more values related to a state of the load; and
   altering the switching state of the PIN diode switch based on the determined one or more values.

22. A plasma load impedance matching circuit selectively operable in a normal matching mode and a protection mode, the circuit comprising:
   a control circuit configured to, while the plasma load impedance matching circuit is operating in the normal matching mode, cause the plasma load impedance matching circuit to operate in the protection mode in response to determining that a load is in a hazardous state;
   a set of reactances in a first reactance arrangement configured to transform an impedance of the load to an impedance within a range of a nominal impedance of an HF generator in the normal matching mode; and
   a PIN diode switch having a first invariable switching state in the normal matching mode, and a second switching state that reconfigures the set of reactances into a second reactance arrangement in the protection mode;
   wherein the second reactance arrangement is configured to transform the impedance of the load to an impedance sufficient to prevent damage to the HF generator or to transmission circuitry arranged between the HF generator and the load and further comprising a DC voltage source having an associated overshoot device and associated with the PIN diode switch to produce a reverse bias voltage.

* * * * *